(12) United States Patent
Rahimo et al.

(10) Patent No.: US 9,064,925 B2
(45) Date of Patent: Jun. 23, 2015

(54) POWER SEMICONDUCTOR DEVICE

(71) Applicant: ABB Technology AG, Zurich (CH)

(72) Inventors: Munaf Rahimo, Uezwil (CH); Arnost Kopta, Zürich (CH); Christoph Von Arx, Olten (CH); Maxi Andenna, Fislisbach (CH)

(73) Assignee: ABB TECHNOLOGY AG, Zürich (CH)

( * ) Notice: Subject to any disclaimer, the term of this patent is extended or adjusted under 35 U.S.C. 154(b) by 233 days.

(21) Appl. No.: 13/625,591

(22) Filed: Sep. 24, 2012

(65) Prior Publication Data
US 2013/0026537 A1 Jan. 31, 2013

Related U.S. Application Data

(63) Continuation-in-part of application No. PCT/EP2011/054423, filed on Mar. 23, 2011.

(30) Foreign Application Priority Data

Mar. 23, 2010 (EP) .................................... 10157392

(51) Int. Cl.
*H01L 29/739* (2006.01)
*H01L 29/423* (2006.01)

(52) U.S. Cl.
CPC ........ *H01L 29/7397* (2013.01); *H01L 29/4232* (2013.01); *H01L 29/7395* (2013.01)

(58) Field of Classification Search
CPC ............ H01L 29/0696; H01L 29/1095; H01L 29/66325; H01L 29/66333; H01L 29/6634; H01L 29/66348; H01L 21/302; H01L 29/7393; H01L 29/7397; H01L 29/7396
USPC ......... 257/139, 140, 141, 142, 143, 144, 145, 257/E29.027, E29.066, E29.197, E29.198, 257/E29.2, E21.382, E21.383, E21.384, 257/E21.385; 438/133, 134, 135, 136, 137, 438/138, 139, 140
See application file for complete search history.

(56) References Cited

U.S. PATENT DOCUMENTS 4,782,379 A 11/1988 Baliga
5,326,711 A 7/1994 Malhi
(Continued)

FOREIGN PATENT DOCUMENTS

WO WO 2004/032243 A1 4/2004
WO WO 2010/109596 A1 9/2010

OTHER PUBLICATIONS

International Search Report (PCT/ISA/210) issued on Jun. 14, 2011, by the European Patent Office as the International Searching Authority for International Application No. PCT/EP2011/054423.
(Continued)

*Primary Examiner* — Eva Y Montalvo
*Assistant Examiner* — Samuel Lair
(74) *Attorney, Agent, or Firm* — Buchanan Ingersoll & Rooney PC

(57) ABSTRACT

A power semiconductor device is disclosed with layers of different conductivity types between an emitter electrode on an emitter side and a collector electrode on a collector side. The device can include a drift layer, a first base layer in direct electrical contact to the emitter electrode, a first source region embedded into the first base layer which contacts the emitter electrode and has a higher doping concentration than the drift layer, a first gate electrode in a same plane and lateral to the first base layer, a second base layer in the same plane and lateral to the first base layer, a second gate electrode on top of the emitter side, and a second source region electrically insulated from the second base layer, the second source region and the drift layer by a second insulating layer.

23 Claims, 9 Drawing Sheets

(56) References Cited

U.S. PATENT DOCUMENTS

| | | | |
|---|---|---|---|
| 6,114,727 A * | 9/2000 | Ogura et al. | 257/342 |
| 6,188,109 B1 * | 2/2001 | Takahashi | 257/355 |
| 6,211,549 B1 * | 4/2001 | Funaki et al. | 257/329 |
| 6,642,599 B1 * | 11/2003 | Watabe et al. | 257/509 |
| 2006/0001084 A1 | 1/2006 | Kelly et al. | |
| 2007/0108468 A1 | 5/2007 | Takahashi | |
| 2008/0076238 A1 * | 3/2008 | Miyashita et al. | 438/527 |
| 2009/0008674 A1 * | 1/2009 | Udrea | 257/138 |

OTHER PUBLICATIONS

Search Report issued on Aug. 30, 2010, by the European Patent Office for Application No. 10157392.1.

Kang et al., "Trench Emitter IGBT with Lateral and Vertical MOS Channels", 23$^{rd}$ International Conference on Microelectronics, IEEE, May 2002, pp. 163-166, vol. 1.

* cited by examiner

POWER SEMICONDUCTOR DEVICE

RELATED APPLICATION

This application claims priority as a continuation-in-part application under 35 U.S.C. §120 to PCT/EP2011/054423, which was filed as an International Application on Mar. 23, 2011 designating the U.S., and which claims priority to European Application 10157392.1 filed in Europe on Mar. 23, 2010. The entire contents of these applications are hereby incorporated by reference in their entireties.

FIELD

The present disclosure relates to the field of power semiconductor devices, such as a power semiconductor device with layers of different conductivity types.

BACKGROUND INFORMATION

FIG. 1 shows a known IGBT with planar gate electrodes. The IGBT is a device with a four-layer structure, which are arranged between an emitter electrode 2 on an emitter side 11 and a collector electrode 25 on a collector side 15, which is arranged opposite of the emitter side 11. An (n-) doped drift layer 6 is arranged between the emitter side 11 and the collector side 15. A p doped planar base layer 405 is arranged between the drift layer 6 and the emitter electrode 2, which planar base layer 405 is in direct electrical contact to the emitter electrode 2. A planar n-doped source region 505 is arranged on the emitter side 11 embedded into the planar base layer 405 and contacts the emitter electrode 2.

A planar gate electrode 305 is arranged on top of the emitter side 11. The planar gate electrode 305 is electrically insulated from the planar base layer 405, the planar source region 505 and the drift layer 6 by a planar insulating layer 306. There is a further insulating layer 309 arranged between the planar gate electrode 305 and the emitter electrode 2.

The terms "planar" or "trench" base layer and "planar" or "trench" source region can be considered to distinguish the layers from each other for the different device types, not to imply any special design or any further technical meaning.

Such a planar MOS cell design can exhibit various characteristics when applied to BiMOS type switch concepts. The device can have high on-state losses due to a plurality of effects. The planar design offers a lateral MOS channel which can incur charge spreading (also called JFET effect) near the cell. Therefore the planar cells show low carrier enhancement. Furthermore, due to the lateral channel design, the planar design can incur hole drain effect (PNP effect) due to the bad electron spreading out of the MOS channel. The region between the cells offers strong charge enhancement for the PiN diode part. This PiN effect, however, can only show a positive impact in high voltage devices with low cell packing densities (a low number of cells in an area). In order to achieve reduced channel resistance the planar devices are made with less cell packing density, and this can only be compensated with narrow pitches (distance between two cells), thereby reducing the PiN effect.

Concerning the blocking capability the planar design can provide good blocking capability due to low peak fields at the cells and between the cells.

The planar design can have a large MOS accumulation region below the gate electrode and large associated capacitance. Nevertheless, the device can show good controllability due to the application of a field oxide type layer between the cells for miller capacitance reduction. Therefore, good controllability and low switching losses can be achieved for planar design.

Furthermore, the cell densities in planar designs can be easily adjusted for the required short circuit currents.

As a result taking all above mentioned effects into account, known planar cells apply very narrow cells and wide pitches with Field Oxide layers.

Alternatively to planar designs, trench MOS cell designs as shown in FIG. 2 have been introduced, in which a trench gate electrode 300 is electrically insulated from a trench base layer 400, a trench source region 500 and the drift layer 6 by a trench insulating layer 301. The trench gate electrode 300 is arranged in the same plane and lateral to the trench base layer 400 and extends deeper into the drift layer 6 than the trench base layer 400.

With such trench gate electrode designs, the on-state losses are lower, because the trench design offers a vertical MOS channel, which provides enhanced injection of electrons in the vertical direction and incurs no drawbacks from charge spreading (so called JFET effect) near the cell. Therefore the trench cells can possess improved carrier enhancement for lower losses. Due to the vertical channel design, the trench offers also less hole drain effect (PNP effect) due to improved electron spreading out of the MOS channel. At the bottom of the trench there is an accumulation layer, which offers strong charge enhancement for the PIN diode part. Hence wide and/or deep trenches can optimize performance. The trench design offers large cell packing density for reduced channel resistance. The trench design, however, can incur lower blocking capability near the bottom corners of the trenches due to high peak electric fields. The trench design has a large MOS accumulation region and associated capacitance with difficulty to apply field oxide type layers in the trench for miller capacitance reduction. Therefore, the device can possess diminished controllability and high switching losses. Furthermore, the high cell densities in trench designs can result in high short circuit currents.

In "Trench emitter IGBT with lateral and vertical MOS channels" (Proc. 23$^{rd}$ Internat. Conf. on Microelectronics (MIEL 2002), 163-166) an IGBT is described, which includes trench gate electrodes and planar gate electrodes in one device. However, due to the full application of the planar and trench gate design (e.g., i.e. channels are formable between emitter electrode and drift layer at the trench gate electrode as well as at the planar gate electrode), challenges of the planar and trench gate designs are still present in the combined design device.

SUMMARY

A power semiconductor, is disclosed comprising, a drift layer of a first conductivity type arranged between an emitter electrode on an emitter side and a collector electrode on a collector side of the device; a first base layer of a second conductivity type arranged between the drift layer and the emitter electrode, which first base layer is in direct electrical contact to the emitter electrode; a first source region of the first conductivity type arranged at the emitter side embedded into the first base layer in contact with the emitter electrode, which first source region has a higher doping concentration than the drift layer; a plurality of first gate electrodes, each electrically insulated from the first base layer, the first source region and the drift layer by a first insulating layer, which first gate electrode is arranged in a same plane and lateral to the first base layer and extends deeper into the drift layer than the first base layer, a channel being formable between the emitter electrode, the first source region, the first base layer and the drift layer; and a second base layer of the second conductivity type, a second source region of the first conductivity type and a second gate electrode, wherein: the second gate electrode is arranged outside an area between the emitter side and the collector side, the second gate electrode is electrically insulated from the second base layer, the second source region and the drift layer by a second insulating layer; wherein: the second source region is arranged at the emitter side embedded into the second base layer and extends into a region past the second gate electrode, which second source region has a higher doping concentration than the drift layer; wherein: the second base layer is arranged in a same plane and lateral to the first base layer; and wherein the first and second source regions are connected to each other by a connection source region, which is arranged between two such first gate electrodes and thereby separates said two first gate electrodes.

BRIEF DESCRIPTION OF THE DRAWINGS

The subject matter disclosed herein will be explained in more detail in the following text with reference to the attached drawings, in which.

The reference symbols used in the figures and their meaning are summarized in the list of reference symbols. Generally, alike or alike-functioning parts are given the same reference symbols. The described embodiments are meant as examples and are not to be construed as limiting the claims.

DETAILED DESCRIPTION

Figure 1:
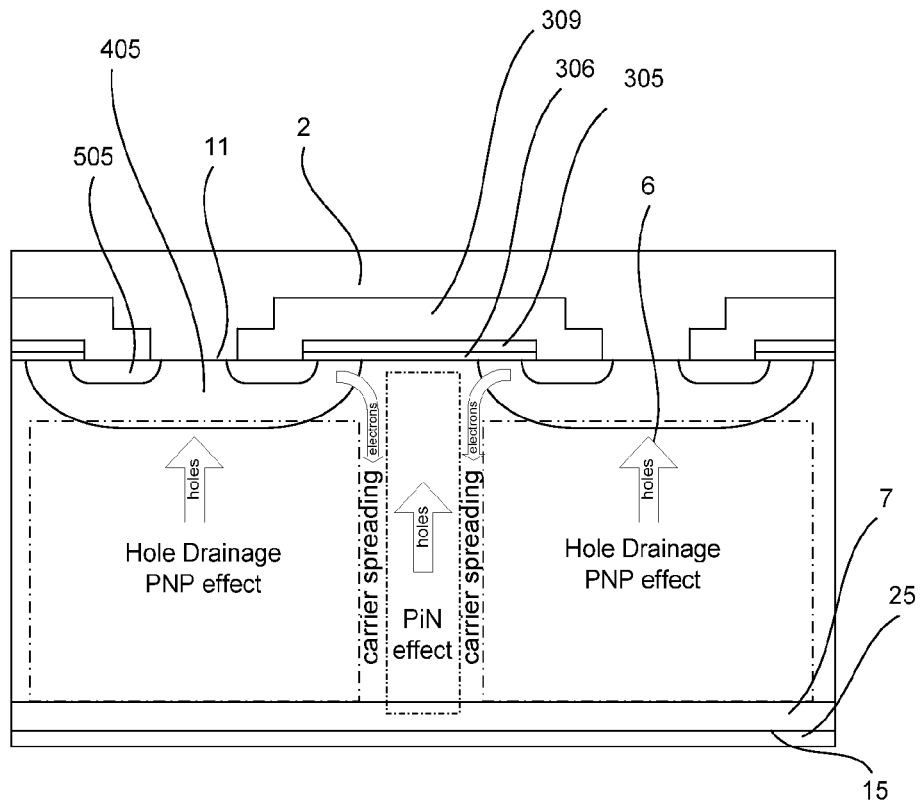
FIG. 1 shows a known IGBT with a planar gate electrode.
Figure 2:
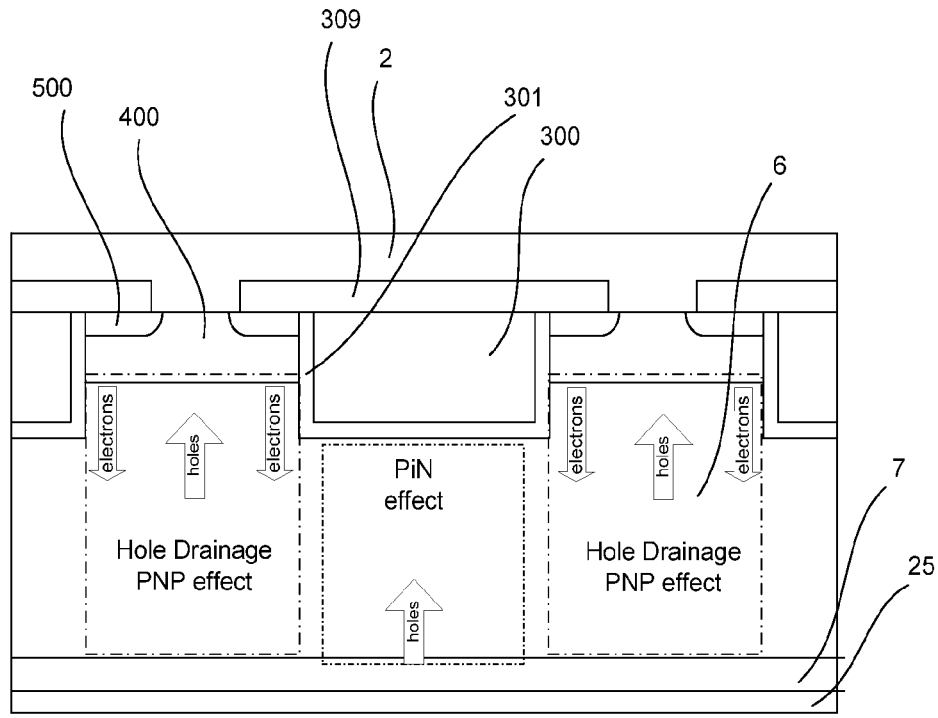
FIG. 2 shows a known IGBT with a trench gate electrode.

A power semiconductor device is disclosed which can provide on-state losses, improved blocking capability, low drainage of holes and good controllability.

An exemplary power semiconductor device as disclosed herein has layers of different conductivity types, which layers are arranged between an emitter electrode on an emitter side and a collector electrode on a collector side, which is arranged opposite of the emitter side. The layers can comprise:

a drift layer of a first conductivity type, which is arranged between the emitter side and the collector side, a first base layer of a second conductivity type, which is arranged between the drift layer and the emitter electrode, which first base layer is in direct electrical contact to the emitter electrode, a first source region of the first conductivity type, which is arranged at the emitter side embedded into the first base layer and contacts the emitter electrode, which first source region has a higher doping concentration than the drift layer, first gate electrodes, each of which is electrically insulated from the first base layer, the first source region and the drift layer by a first insulating layer and which first gate electrode is arranged in the same plane and lateral to the first base layer and extends deeper into the drift layer than the first base layer, a channel is formable between the emitter electrode, the first source region, the first base layer and the drift layer, a second base layer of the second conductivity type, a second source region of the first conductivity type, and a second gate electrode, which is arranged on top of the emitter side and the second gate electrode is electrically insulated from the second base layer, the second source region and the drift layer by a second insulating layer, the second source region is arranged at the emitter side embedded into the second base layer and extends into a region below the second gate electrode, which second source region has a higher doping concentration than the drift layer, wherein the second base layer is arranged in the same plane and lateral to the first base layer. For example, in a first area of the IGBT, the second source region is not directly connected to the emitter electrode (e.g., it is separated from the emitter electrode by the third insulating layer, which covers the second source region) so that no channel is formable, through which charge carriers can flow directly from the emitter electrode, through the second source region, the second base layer to the drift layer in the first area.

In a second area of the IGBT, the second source region is connected to a connection source region, which is arranged between two first gate electrodes and thereby separates said two first gate electrodes.

An exemplary semiconductor device as disclosed herein integrates both a Planar and Trench MOS cell in a single structure in order to gain advantages of both designs in terms of reduced on-state losses, improved blocking and good controllability.

Advantage of the planar gate design (region between the cells) and trench design (the cell itself) can be combined in the disclosed semiconductor device while disadvantages of the planar cell region, such as high losses, JFET effect, PNP and PiN effect and inter-space between trench cells can be eliminated. In the areas between the planar cells a good charge enhancement can be ensured. This effect is further pronounced, if planar enhanced layers are present. Due to the planar gate structure good field spreading for charge extraction during turn-off and good controllability during turn-on can be provided. On the other hand, the trench cell design offers good electron injection profile and spreading with low hole drain effect.

A very packed cell channel density can be obtained with up to three channels per half cell. Nevertheless, the density can be controlled via the pitch between the cells or by structuring the source regions, or by adjusting the MOS channel parameters, or by removing one of the trench or one of the planar channels.

The source regions can be connected in the third dimension directly or via a MOS channel or also in the planar cell part itself. The base layers can also be connected in a similar way in the third dimension or directly to avoid latch-up in the planar cell.

Furthermore, the device is easy to manufacture, because the inventive design can be manufactured based on a self-aligned process with the potential of applying enhanced layer structures and of applying the inventive structure on a plurality of different device types like emitter switched thyristor structures, and reverse conducting designs in a number of possible combinations. It also offers the possibility to provide different and thereby separately optimize MOS channel parameters (threshold voltage ($V_{th}$), pinch-off voltage ($V_p$) and gate-emitter conductance ($g_{fs}$)) for the trench and planar channels. The inventive design is suitable for full or part stripes but can also be implemented in cellular designs.

Figure 3:
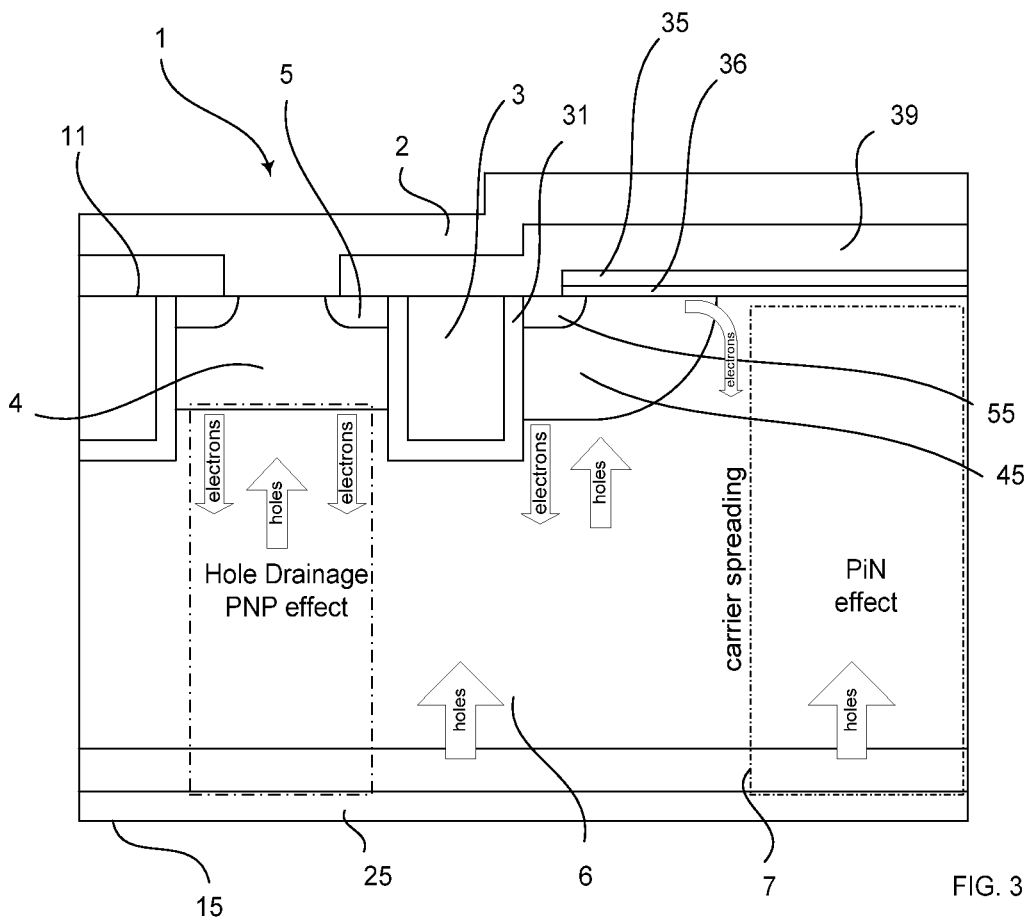
FIG. 3 shows a first exemplary embodiment of a non-punch-through IGBT as disclosed herein.

FIG. 3 shows a first exemplary embodiment of a power semiconductor device 1 in form of an insulated gate bipolar transistor (IGBT) with a four-layer structure (pnpn). The layers are arranged between an emitter electrode 2 on an emitter side 11 and a collector electrode 3 on a collector side 15, which is arranged opposite of the emitter side 11. The IGBT comprises the following layers:

an (n-) doped drift layer 6, which is arranged between the emitter side 11 and the collector side 15, an p doped first base layer 4, which is arranged between the drift layer 6 and the emitter electrode 2, which first base layer 4 is in direct electrical contact to the emitter electrode 2, an n doped first source region 5, which is arranged at the emitter side 11 embedded into the first base layer 4 and contacts the emitter electrode 2, which first source region 5 has a higher doping concentration than the drift layer 6, a first gate electrode 3, which is electrically insulated from the first base layer 4, the first source region 5 and the drift layer 6 by a first insulating layer 31 and which first gate electrode 3 is arranged in the same plane and lateral to the first base layer 4 and extends deeper into the drift layer 6 than the first base layer 4, a channel is formable between the emitter electrode 2, the first source region 5, the first base layer 4 and the drift layer 6, a second n doped source region 55, a second gate electrode 35, which is arranged on top of the emitter side 11 which is electrically insulated from the second base layer 45, the second source region 55 and the drift layer 6 by a second insulating layer 36.

The second source region 55 can be arranged at the emitter side 11 embedded into the second base layer 45 and extends into a region below the second gate electrode 35, which second source region 55 has a higher doping concentration than the drift layer 6, wherein: the second base layer 45 is arranged in the same plane and lateral to the first base layer 4. For example, the second source region 55 is not directly connected to the emitter electrode 2 in a first area of the IGBT. For example, it is separated by the third insulating layer 39 covering the second source region 55, so that no channel is formable in said first area, through which charge carriers can flow directly from the emitter electrode 2, through the second source region 55, the second base layer 45 to the drift layer 6.

The channel at the first gate electrode 3 (trench gate electrode), which is formable between the emitter electrode 2, the first source region 5, the first base layer 4 and the drift layer 6, can be formed during operation of the device.

At the second gate electrode 35 (planar gate electrode) no such channel is formed at said first areas, because the emitter electrode 2 is not attached to the second source region 55.

There are second areas in the IGBT as disclosed herein, in which the first and second source regions 5, 55 are connected by a connection source region 58, wherein the connection source region 58 is connected to the emitter electrode 2.

The first and second areas refer to areas on the emitter side 11 of the IGBT. The first areas are areas, which extend from a first gate electrode 3 (or in the case of an emitter electrode 2' being arranged between the first and second gate electrode 3, 35 like in the embodiment shown in FIG. 19 from said emitter electrode 2') to a second gate electrode 35 and in which area no channel is formable from any emitter sided electrode through the second source region 55 and the second base layer 45 to the drift layer 6. The second base layer 45 extends from the first gate electrode 3 to the second gate electrode 35 in the first area.

The plane referred to above for the first gate electrode 3 and the second base layer 45 can be a plane, which lies parallel to the emitter side 11. The first gate electrode 3 is of course also electrically insulated from the second base layer 45 and from the second source region 55, if the second source region 55 extends to the first insulating layer 31.

In the case of the device being an IGBT as shown in FIG. 1, a p doped collector layer 7 can be arranged on the collector side 15 between the drift layer 6 and the collector electrode 25.

An exemplary device as disclosed herein can comprise a different number of first gate electrodes than of second gate electrodes. Exemplary embodiments include devices, which comprise at least one first trench gate electrode 3 and at least one second planar gate electrode 35.

For example, there can be a third insulating layer 39 arranged above the second gate electrode 35 in the first area, by which third insulating layer 39 the gate electrode 35 is covered and thereby electrically insulated from the emitter electrode 2. Also the first gate electrode 3 can be covered on the emitter side 11 with the third insulating layer. For example, the third insulating layer covers the second source region 55 and the second base layer 45 in the first area, so that in the first area these layers are separated from the emitter electrode 2 (or any other electrode on the emitter side).

Figure 4:
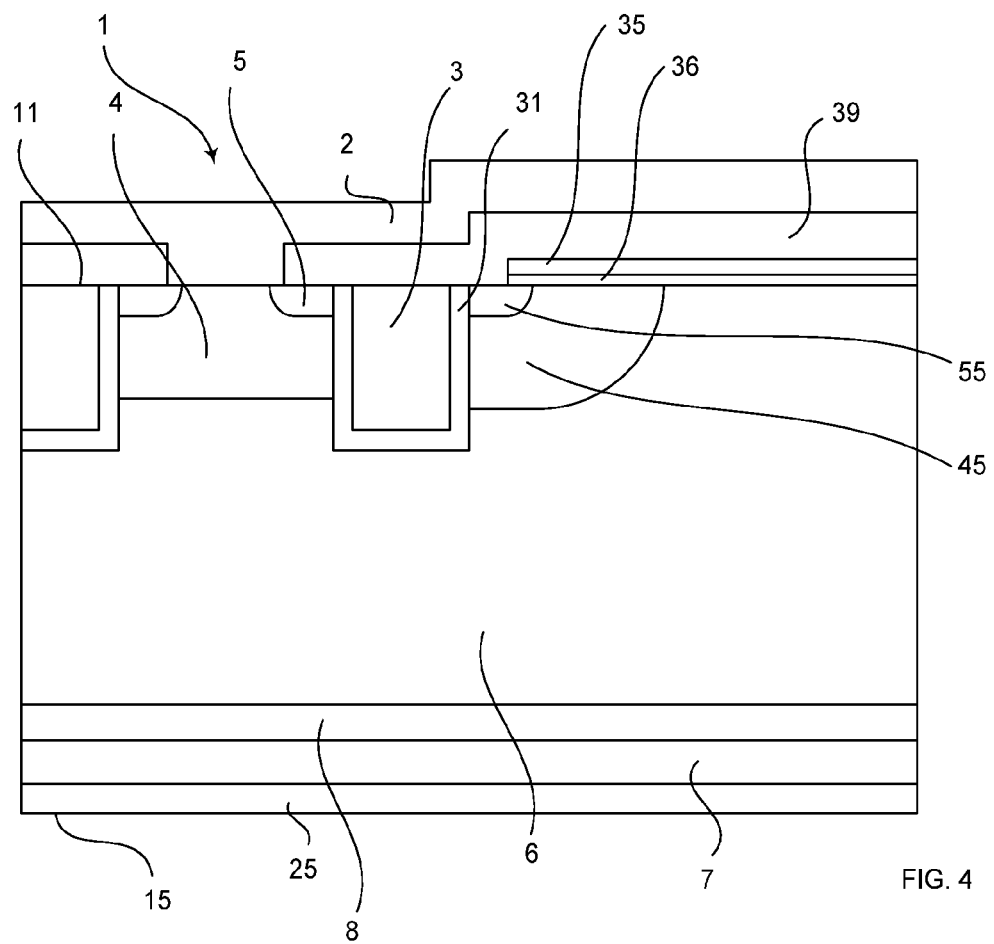
FIG. 4 shows another exemplary embodiment of a punch-through IGBT as disclosed herein.

As shown in FIG. 4 the device 1 may further comprise an n doped buffer layer 8 with a higher doping concentration than the drift layer 6, which is arranged between the drift layer 6 and the collector electrode 25. For an IGBT with a collector layer 7 like the device in FIG. 4, the buffer layer 8 is arranged between the (n-) doped drift layer 6 and the p doped collector layer 7.

Figure 5:
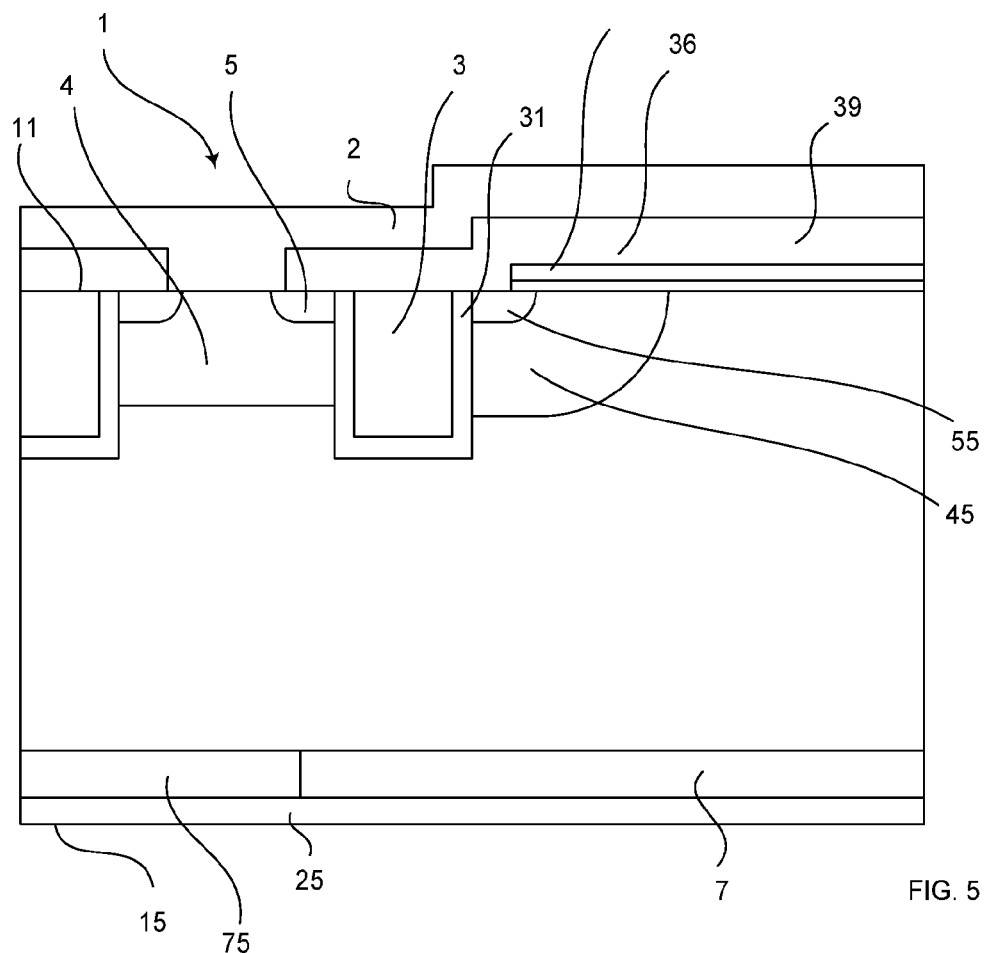
FIG. 5 shows another exemplary embodiment of a reverse conducting IGBT as disclosed herein.

An exemplary gate electrode design as disclosed herein can be applied to a plurality of different semiconductor types like a reverse conducting IGBT as shown in FIG. 5, in which a first n-doped region 75 is arranged on the collector side 15 lateral to and in the same plane as the collector layer 7. "Same plane" shall, for example, be understood as a plane parallel to the collector side 15. The first region 75 has a higher doping concentration than the drift layer 6. It could also be applied to a MOSFET, (e.g., to a device with a drift layer 6, optionally a buffer layer 8 and then a collector electrode 25 (e.g., having no collector layer)).

Figure 6:
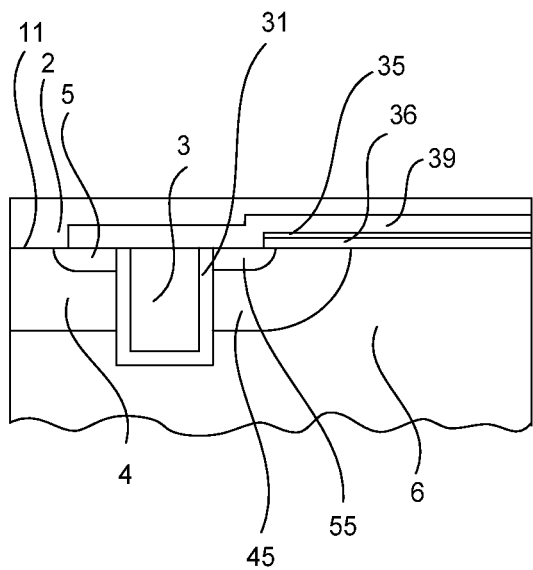
FIGS. 6-14 show details of other exemplary embodiments of semiconductor devices as disclosed herein.

The disclosed semiconductor devices can also comprise a gate electrode design with one planar gate electrode and a plurality of trench gate electrodes. Such devices are shown in FIGS. 4 and 6 with, for example, a higher number of trench gate electrodes than planar gate electrodes. The cell packing density, which is the number of cells in an area, can be increased tremendously by adding a plurality of trench gate electrodes, and the positive effect of the presence of the planar gate electrode like good blocking capability, controllability and low switching losses can still be kept. By not connecting the second base layer to the emitter electrode in the first area it is avoided that the trench channel drains charge from the planar channel. The second base layer extends from the second planar gate electrode 35 (planar gate electrode) to the first gate electrode 3 (trench gate electrode), being separated from the gate electrodes only by the first insulating layer 31 and second insulating layer 36, respectively.

Figure 7:
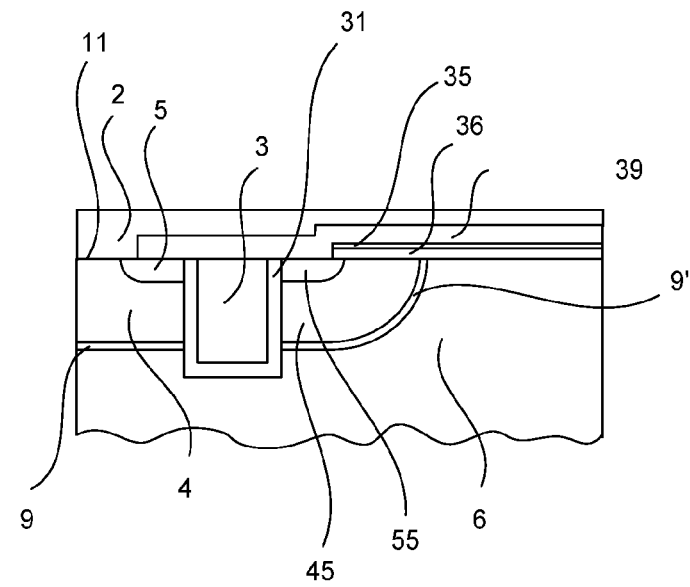
Figure 8:
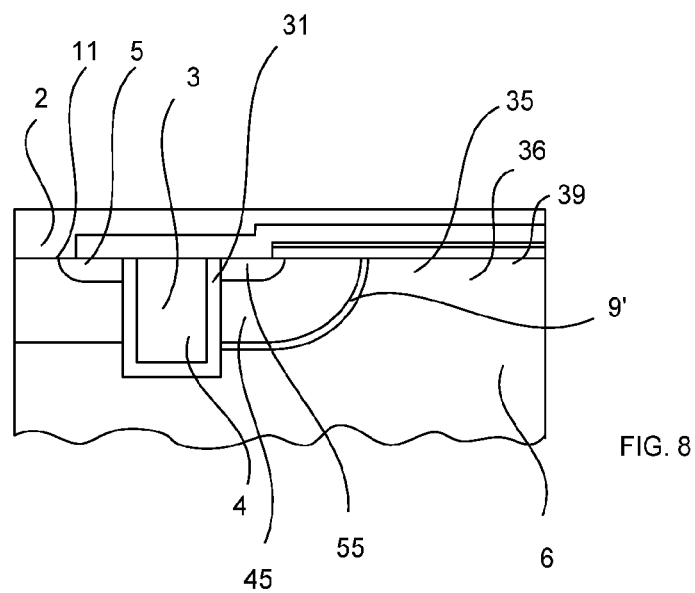
Figure 9:
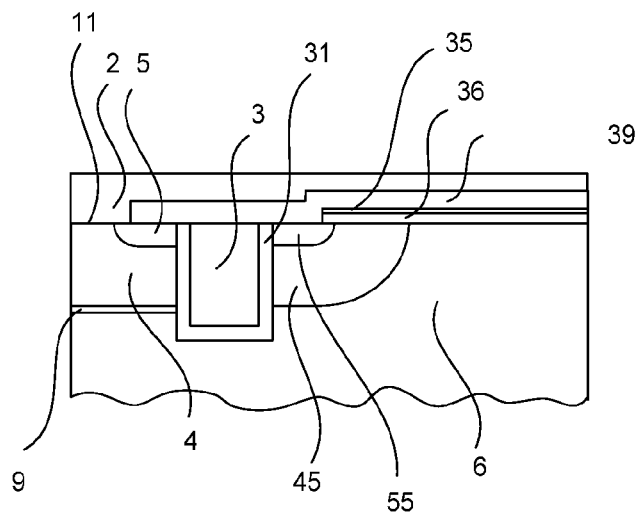

The FIGS. 6 to 14 show the emitter side 11 of exemplary semiconductor devices in more details. For clarity reasons, there is no emitter electrode 2 shown in the figures The FIGS. 7 to 9 show other exemplary embodiments, in which the disclosed device comprises an n-doped enhancement layer 9, 9', which has a higher doping concentration than the drift layer 6. The enhancement layer 9, 9' is arranged between and thereby separates the drift layer 6 and either the first base layer 4 (enhancement layer 9 shown in FIG. 9), the second base layer 45 (enhancement layer 9' shown in FIG. 8) or the first as well as the second base layer 4, 45 (enhancement layer 9 and 9' shown in FIG. 7).

Figure 10:
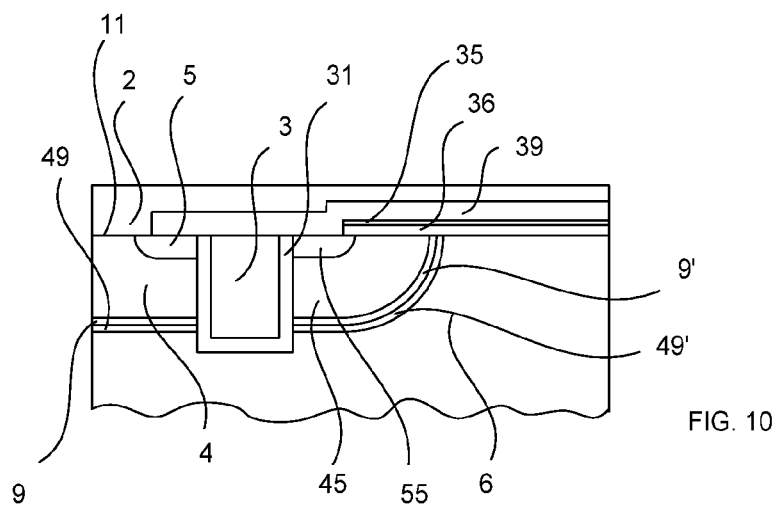

Additionally to such an enhancement layer 9, 9', the device may further comprise a p doped third base layer 49, 49', which is arranged between and thereby separates the drift layer 6 and the enhancement layer 9 below the first base layer 4, the second base layer 45 or both of the first and second base layer 4, 45. As shown in FIG. 10 the enhancement layer 9, 9' as well as the third base layer 49, 49' may be arranged between the drift layer 6 and the first as well as the second base layer 4, 45.

Figure 11:
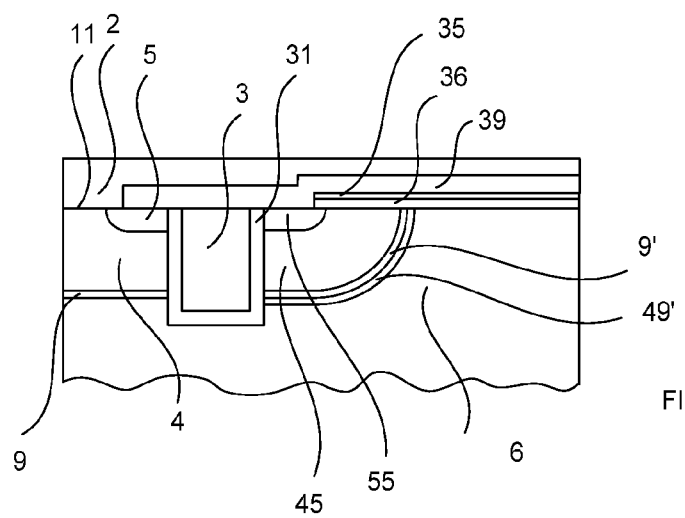

Alternatively, as shown in FIG. 11, only the enhancement layer 9 arranged below the first base layer 4, whereas the enhancement layer 9' as well as the third base layer 49' are arranged below the second base layer 45.

Figure 12:
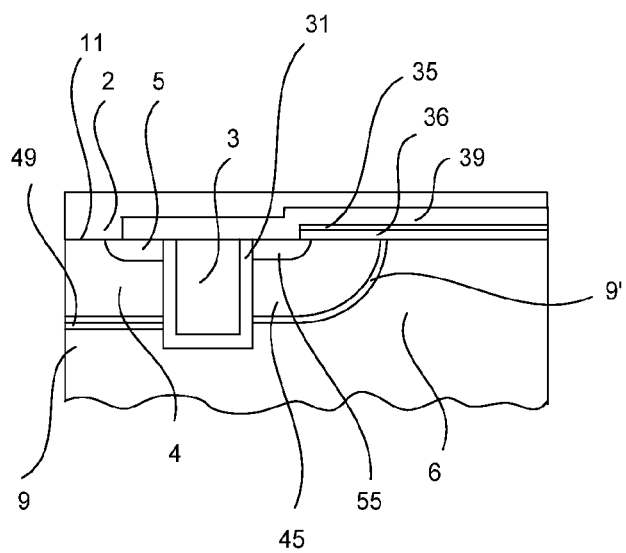

In another alternative, as shown in FIG. 12, there may be only the enhancement layer 9' arranged below the second base layer 45, whereas the enhancement layer 9 as well as the third base layer 49 are arranged below the first base layer 4.

Figure 13:
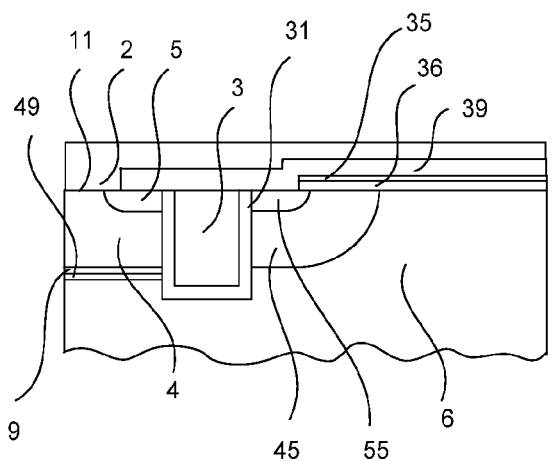

It is also possible as shown in FIG. 13, to have neither an enhancement layer 9' nor a third base layer 49' arranged below the second base layer 45, whereas below the first base layer 4 there is the enhancement layer 9 as well as the third base layer 49 arranged. Of course, also the other possibility of having no layer 9, 49 below the first base layer 4, but both layers 9', 49' below the second base layer 45 can be realized.

Figure 14:
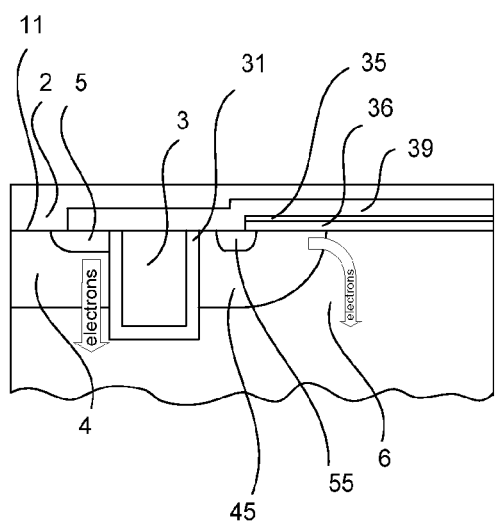

In yet another exemplary embodiment as shown in FIG. 14, the second source region 55 is separated from the first insulating layer 31 by the second base layer 45, so that the device comprises two electrically conductive channels per half cell, whereas in the device (e.g., as shown in FIG. 3 or 6) the half cell comprises three channels per half cell. The channels are shown in FIG. 3 by the arrows marked with "electrons". One half-cell comprises the three right handed arrows.

Similarly, a planar channel can be eliminated in a half-cell (e.g., by not elongating a source region to a region below a planar gate electrode, by not connecting the source region to the emitter electrode or by omitting a source region usable for a channel to a planar gate electrode completely).

Figure 15:
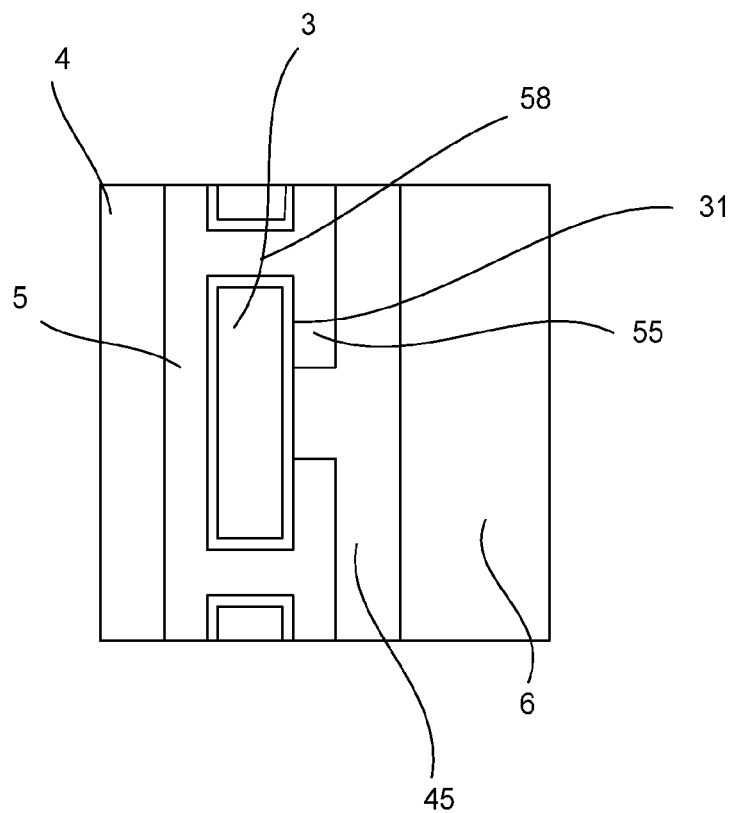
FIG. 15 shows a top view onto the emitter side of another exemplary embodiment of a semiconductor device as disclosed herein.

FIG. 15 shows a top view on the emitter side 11 without any second gate electrode or emitter electrode on top (view along the cut D-D of FIG. 6).

Figure 16:
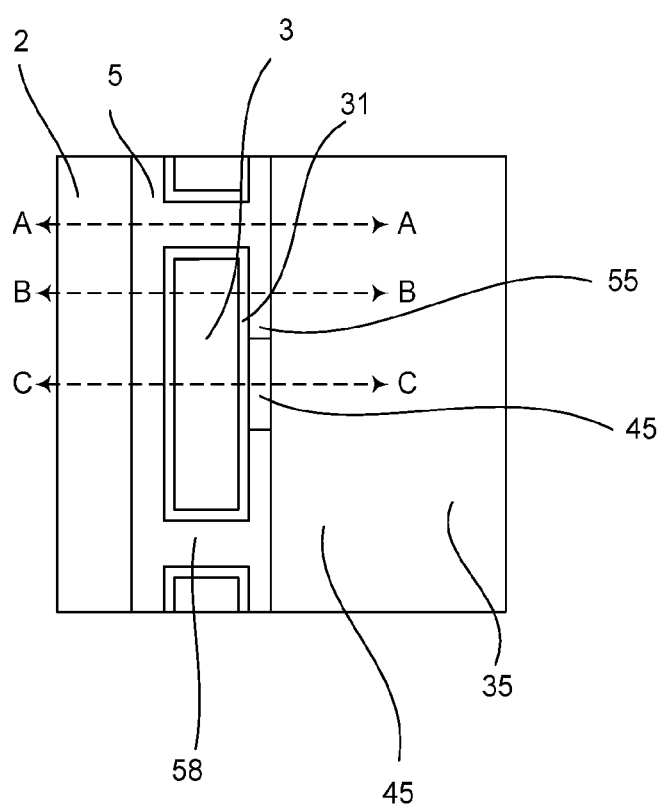
FIG. 16 shows a top view onto the emitter side of another exemplary embodiment of a semiconductor device as disclosed herein including the emitter electrode and the second gate electrode.

In FIG. 16 shows a similar view, but emitter electrode 2 and second gate electrode 35 are shown. For clarity reasons, the second and third insulating layers 36, 39 are not included in the figure.

Figure 17:
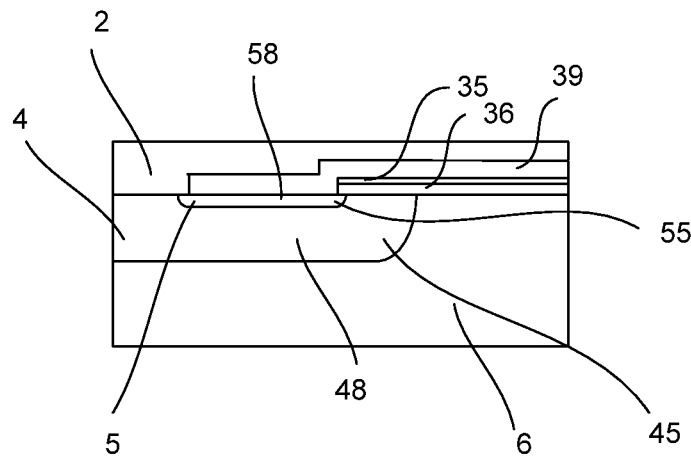
FIG. 17 shows the cross-section for the exemplary embodiment of a semiconductor device according to the FIG. 15 along the cut A-A.

The FIGS. 17 to 21 show cross-sections along the cuts A-A, B-B and C-C of FIG. 16. FIG. 17 shows a section, in which the first and second source regions 5, 55 are connected by a connection source region 58. In the area of the connection source region 58 no first gate electrode is present. Thereby, the trench gate electrode is split into a plurality of first gate electrodes 3. The plurality of the first gate electrodes 3 may be arranged in a line between the first and second base layers 4, 45, and the first and second source regions 5, 55 are connected to each other by connection source regions 58, which are arranged between two such first gate electrodes 3 and thereby separate said two first gate electrodes 3. Also any other arrangement of the first gate electrodes is possible.

In an exemplary IGBT, there are first areas, in which the second source region 55 is separated from the emitter electrode 2 (or any other electrode on the emitter side) by the third insulating layer 39 covering the second source region 55 (like in FIG. 3). The third insulating layer 39 covers in this first area the second source regions, and if the second base layer 45 extends to the emitter side 11, the third insulating layer 39 also covers the second base layer 45.

There are second areas in an exemplary IGBT, in which the first and second source regions 5, 55 are connected by a connection source region 58, wherein the connection source region 58 is connected to the emitter electrode 2 (as in FIG. 17). By this connection, a channel from the connection source region 58 to the second base layer 45 and the drift layer 6 (e.g., to the regions below the planar gate electrode) is created. In the second area, in which the connection source region 58 contacts the emitter electrode 2, no first gate electrode 3 is arranged (see FIG. 17).

Also the first and second base layers 4, 45 can be connected in this embodiment in a similar way. The plurality of the first gate electrodes 3 can be arranged in a line (or any other arrangement) between the first and second base layers 4, 45, and the first and second base layers 4, 45 are connected to each other by connection base layers 48, which are arranged between two such first gate electrodes 3 and thereby separate said two first gate electrodes 3.

Figure 18:
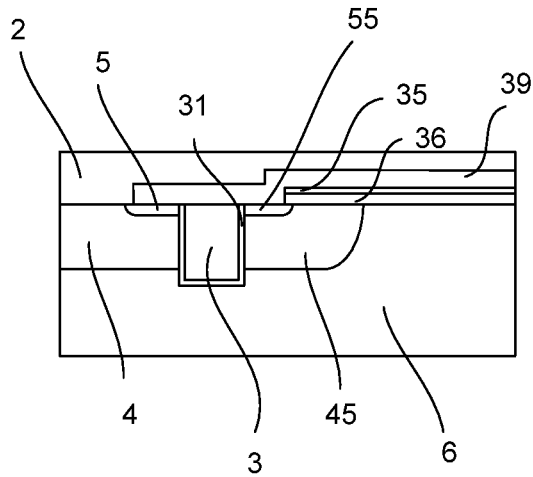
FIGS. 18 and 19 show the cross-section for different exemplary embodiments of semiconductor devices according to the FIG. 15 along the cut B-B.

FIG. 18 shows a cut along the line B-B of FIG. 16. The second source region 55 extends to the first as well as to the second insulating layer 31, 36 in such a way that a conductive channel can be formed during operation of the device.

Figure 19:
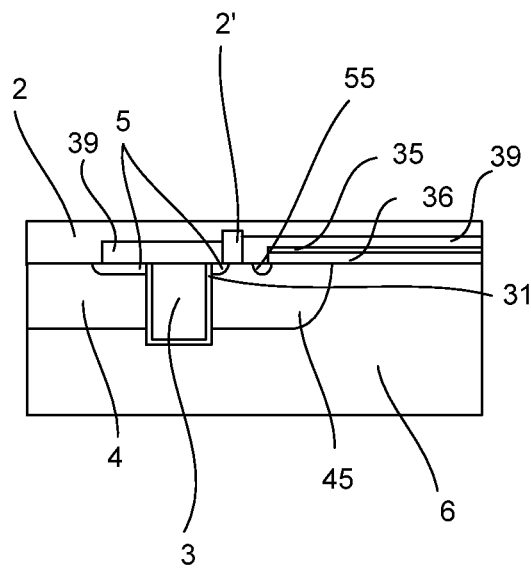

Alternatively, as shown in FIG. 19, there is a first source region 3 arranged on the side of the first gate electrode, which is electrically connected to a further emitter electrode 2'. The second source region 55 is separated from the emitter electrode 2 in this first area by the second base layer 45, which is arranged between the second source region 55 and the emitter electrode 2' in the plane of the emitter side 11, and to which the emitter electrode 2' is connected to. This ensures that no channel is formable below the planar gate electrode 35 from the emitter electrode 2' in this first area, but a channel is formable from the emitter electrode 2', through the first source region 5 and the first base layer along the first gate electrode 3 (on the right side of the first gate electrode 3 in FIG. 19).

Figure 20:
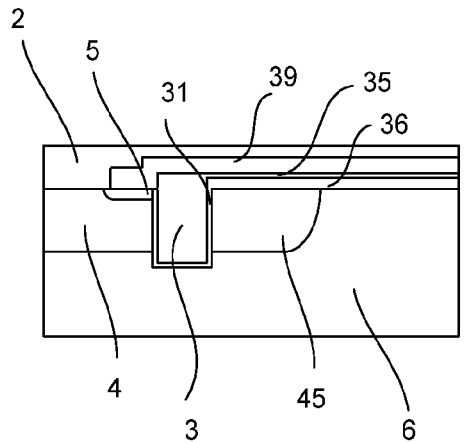
FIGS. 20 and 21 show the cross-section for different exemplary embodiments of semiconductor devices according to the FIG. 15 along the cut C-C.
Figure 21:
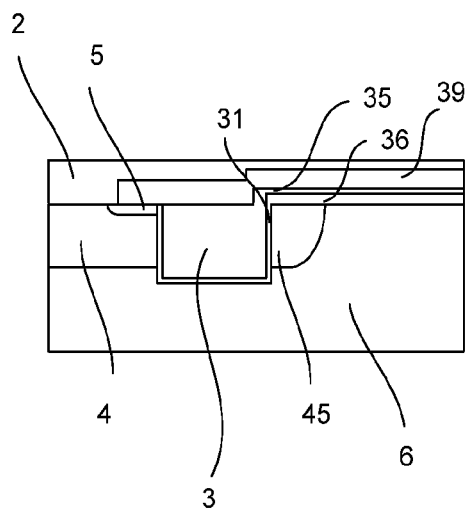

It is shown in FIG. 20 that along the cut C-C the first and second gate electrode 3, 35 may also be electrically connected to each other. Such a connection can be made (e.g., by extending the second gate electrode 35 in the area of the cut C-C to a region above the first gate electrode 3 so that it projects above the first gate electrode 3) and thereby contacts the first gate electrode 3. In another embodiment, the width of the first gate electrode 3 in this area may also be extended such that the gate electrodes 3, 35 are in contact. Of course, in order to achieve an electrical contact in the contact area of the gate electrodes 3, 35 no insulating layer 31, 36 is arranged between the gate electrodes 3, 35 in this area.

The first and second gate electrodes 3, 35, the source regions 5, 55 and base layers 4, 45 do not necessarily have to be connected to each other in the device. In case of the first and second gate electrodes 3, 35 being connected to each other the connection can be made within the device as elaborated above, but the connection could also be made as an electrical connection outside the device (e.g., by wiring). The embodiments in the figures shall be understood only as examples for achieving a connection and thereby an electrical contact between the first and second gate electrodes 3, 35, the source regions 5, 55 and the base layers 4, 45. The invention shall not be limited by these examples and any way to achieve such electrical contacts shall be included.

Figure 22:
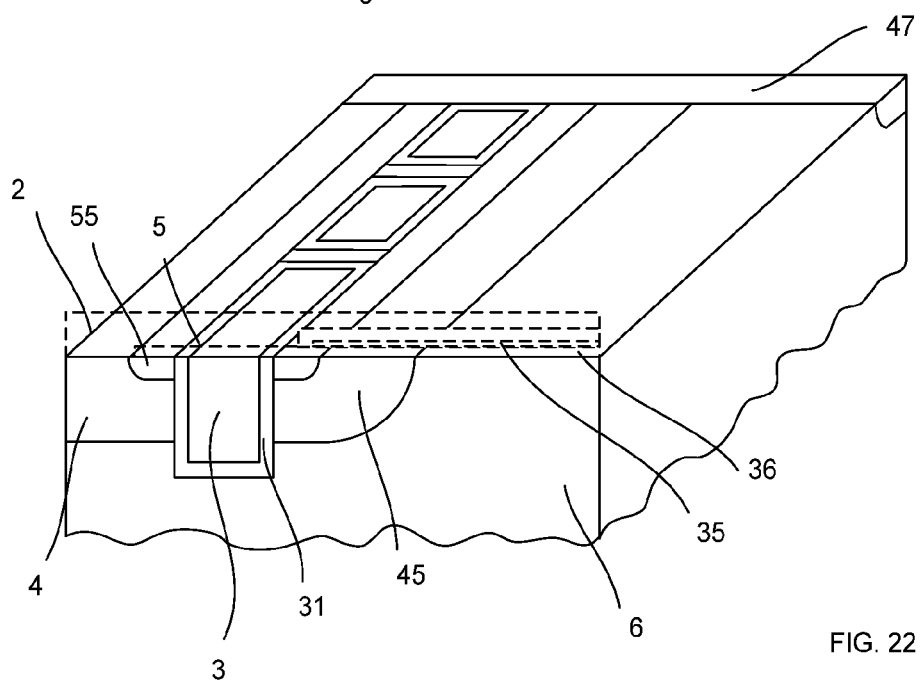
FIG. 22 shows a sectional top view onto another exemplary embodiment of semiconductor device as disclosed herein.

FIG. 22 shows a further embodiment, in which the semiconductor device 1 comprises a p doped bar 47 with a higher doping concentration than the first and second base layers 4, 45. The bar 47 is arranged at the emitter side 11 and at the bar 47 the first and second source regions 5, 55, base layers 4, 45 and the first gate electrode 3 terminate. The bar 47 may be at least partly or completely covered by the second gate electrode 35, but in another embodiment the second gate electrode 35 may is terminated so that it does not project above the bar 47. In this embodiment, the emitter and gate electrodes can be formed in respect to the base layers and source regions according to any of the above mentioned kinds. The emitter electrode 2 and gate electrode 35 are indicated in FIG. 22 by a dashed line in the plane, along which the device is cut through for the sectional view.

In another embodiment, the conductivity types are switched (e.g., all layers of the first conductivity type are p type, such as the drift layer 6, the first and second source region 5, 55) and all layers of the second conductivity type are n type (e.g. first and second base layers 4, 45).

It should be noted that the term "comprising" does not exclude other elements or steps and that the indefinite article "a" or "an" does not exclude the plural. Also elements described in association with different embodiments may be combined. It should also be noted that reference signs in the claims shall not be construed as limiting the scope of the claims.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE SYMBOLS

1 Power semiconductor device
11 Emitter side
15 Collector side
2 Emitter electrode
25 Collector electrode
3 First gate electrode
31 First insulating layer
35 Second gate electrode
36 Second insulating layer
39 Third insulating layer
300 Trench gate electrode
301 Trench insulating layer
305 Planar gate electrode
306 Planar insulating layer
309 Further insulating layer
4 First base layer
45 Second base layer
47 P doped bar
48 Connection base layer
49, 49' Third base layer
400 Trench base layer
405 Planar base layer
5 First source region
55 Second source region
58 Connection source region
500 Trench source region
505 Planar source region
6 Drift layer
7 Collector layer
75 First region
8 Buffer layer
9, 9' Enhancement layer

The invention claimed is:
1. A power semiconductor, comprising:
a drift layer of a first conductivity type arranged between an emitter electrode on an emitter side and a collector electrode on a collector side of the device;
a first base layer of a second conductivity type arranged between the drift layer and the emitter electrode, which first base layer is in direct electrical contact to the emitter electrode;
a first source region of the first conductivity type arranged at the emitter side embedded into the first base layer in contact with the emitter electrode, which first source region has a higher doping concentration than the drift layer;
a plurality of first gate electrodes, each electrically insulated from the first base layer, the first source region and the drift layer by a first insulating layer, which first gate electrode is arranged in a same plane and lateral to the first base layer and extends deeper into the drift layer than the first base layer, a channel being formable between the emitter electrode, the first source region, the first base layer and the drift layer; and
a second base layer of the second conductivity type, a second source region of the first conductivity type and a second gate electrode, wherein:
the second gate electrode is arranged outside an area between the emitter side and the collector side, the second gate electrode is electrically insulated from the second base layer, the second source region and the drift layer by a second insulating layer; wherein:
the second source region is arranged at the emitter side embedded into the second base layer and extends into a region past the second gate electrode, which second source region has a higher doping concentration than the drift layer; wherein:
the second base layer is arranged in a same plane and lateral to the first base layer; and
wherein the first and second source regions are connected to each other by a connection source region, which is arranged between two such first gate electrodes and thereby separates said two first gate electrodes.
2. Device according to claim 1, wherein the second source region is separated from the emitter electrode so as to pre- clude charge carrier flow directly from the emitter electrode, through the second source region and the second base layer, to the drift layer.

3. Device according to claim 1, wherein the first and second gate electrodes are electrically connected.

4. Device according to claim 1, comprising:
a buffer layer of the first conductivity type with a higher doping concentration than the drift layer, arranged between the drift layer and the collector electrode.

5. Device according to claim 1, comprising:
a collector layer of the second conductivity type arranged on the collector side between the drift layer and the collector electrode; or comprising:
a buffer layer of the first conductivity type with a higher doping concentration than the drift layer, which buffer layer is arranged on the collector side between the drift layer and the collector electrode; and a collector layer of the second conductivity type, which is arranged on the collector side between the buffer layer and the collector electrode.

6. Device according to claim 1, wherein the second source region extends to the first insulating layer.

7. Device according to claim 1, wherein the second source region is separated from the first insulating layer by the second base layer.

8. Device according to claim 1, wherein the second source region is electrically connected to the emitter electrode.

9. Device according to claim 1, wherein the second source region is electrically insulated from the emitter electrode.

10. Device according to claim 1, comprising:
a first region of the first conductivity type arranged on the collector side lateral to the collector layer, which first region has a higher doping concentration than the drift layer.

11. Device according to claim 1, comprising:
an enhancement layer of the first conductivity type arranged between and thereby separating the drift layer and at least one or both of the first and second base layer.

12. Device according to claim 10, comprising:
a third base layer of the second conductivity type arranged between and thereby separating the drift layer and the enhancement layer below the first base layer, the second base layer or both of the first and second base layer.

13. Device according to claim 1, comprising:
a plurality of first gate electrodes, wherein the first and second base layers are connected to each other by a connection base layer arranged between two such first gate electrodes to thereby separate said two first gate electrodes.

14. Device according to claim 1, comprising:
a bar of the second conductivity type with a higher doping concentration than the first and second base layers, which bar is arranged at the emitter side and at which bar the first and second source regions, the base layers and the first gate electrode terminate.

15. Device according to claim 14, wherein the bar is at least partly or completely covered by the second gate electrode.

16. Device according to claim 1, wherein the second source region is separated from any electrode on the emitter side by a third insulating layer covering the second source region in a first area, and wherein the connection source region is connected to the emitter electrode either directly or via the first source region.

17. Device according to claim 2, comprising:
a buffer layer of the first conductivity type with a higher doping concentration than the drift layer, arranged between the drift layer and the collector electrode.

18. Device according to claim 17, wherein the second source region extends to the first insulating layer.

19. Device according to claim 18, wherein the second source region is electrically connected to the emitter electrode.

20. Device according to claim 19, comprising:
a first region of the first conductivity type arranged on the collector side lateral to the collector layer, which first region has a higher doping concentration than the drift layer.

21. Device according to claim 20, comprising:
an enhancement layer of the first conductivity type arranged between and thereby separating the drift layer and at least one or both of the first and second base layer.

22. Device according to claim 21, comprising:
a plurality of first gate electrodes, wherein the first and second base layers are connected to each other by a connection base layer arranged between two such first gate electrodes to thereby separate said two first gate electrodes.

23. Device according to claim 22, comprising:
a bar of the second conductivity type with a higher doping concentration than the first and second base layers, which bar is arranged at the emitter side and at which bar the first and second source regions, the base layers and the first gate electrode terminate.

* * * * *